(12) United States Patent
Fujiwara

(10) Patent No.: US 9,261,899 B2
(45) Date of Patent: Feb. 16, 2016

(54) ELECTRONIC APPARATUS

(71) Applicant: SONY CORPORATION, Minato-ku (JP)

(72) Inventor: Jiro Fujiwara, Tokyo (JP)

(73) Assignee: Sony Corporation, Tokyo (JP)

( * ) Notice: Subject to any disclaimer, the term of this patent is extended or adjusted under 35 U.S.C. 154(b) by 295 days.

(21) Appl. No.: 13/793,128

(22) Filed: Mar. 11, 2013

(65) Prior Publication Data

US 2013/0250506 A1  Sep. 26, 2013

(30) Foreign Application Priority Data

Mar. 23, 2012  (JP) .................................. 2012-066791

(51) Int. Cl.
| | |
|---|---|
| *H01R 13/641* | (2006.01) |
| *G06F 1/16* | (2006.01) |
| *H05K 7/14* | (2006.01) |
| *H01R 12/72* | (2011.01) |
| *H01R 13/639* | (2006.01) |
| *H05K 5/02* | (2006.01) |
| *H01R 13/629* | (2006.01) |

(52) U.S. Cl.
CPC .................. *G06F 1/16* (2013.01); *H01R 12/72* (2013.01); *H01R 13/639* (2013.01); *H05K 5/0295* (2013.01); *H05K 7/14* (2013.01); *H01R 13/62966* (2013.01); *H01R 2201/06* (2013.01)

(58) Field of Classification Search
CPC ............. H01R 12/7094; H01R 13/641; H01R 12/714; H01R 12/721
See application file for complete search history.

(56) References Cited

U.S. PATENT DOCUMENTS

| | | | | | |
|---|---|---|---|---|---|
| 5,695,351 | A | * | 12/1997 | Kimura ................ | H01R 13/633 439/159 |
| 5,836,775 | A | * | 11/1998 | Hiyama et al. ................ | 439/159 |
| 6,010,344 | A | * | 1/2000 | Muramatsu ............ | G06K 13/08 439/159 |
| 6,381,146 | B1 | * | 4/2002 | Sevier .................. | H05K 7/1411 200/51 R |
| 8,149,424 | B2 | * | 4/2012 | Yomogida .......... | G03G 15/5066 347/108 |
| 2008/0076287 | A1 | * | 3/2008 | Klarner ................... | B60R 11/02 439/304 |
| 2010/0138606 | A1 | * | 6/2010 | Tanaka .................. | G06F 3/0613 711/115 |
| 2010/0255699 | A1 | * | 10/2010 | Takai .................... | G06K 7/0021 439/152 |
| 2011/0171843 | A1 | * | 7/2011 | Casses ................ | B60L 11/1818 439/188 |
| 2013/0196523 | A1 | * | 8/2013 | Lim .................... | H01R 13/6335 439/153 |

FOREIGN PATENT DOCUMENTS

JP          2004-334562          11/2004

* cited by examiner

*Primary Examiner* — Truc Nguyen
(74) *Attorney, Agent, or Firm* — Sony Corporation

(57) ABSTRACT

An electronic apparatus including a connector configured to electrically connect with a terminal of a second electronic device; a first detector configured to detect an electrical connection between the connector and the terminal; a second detector configured to detect physical contact between the connector and the terminal; and circuitry configured to control a lock structure based on outputs of the first and second detectors.

20 Claims, 13 Drawing Sheets

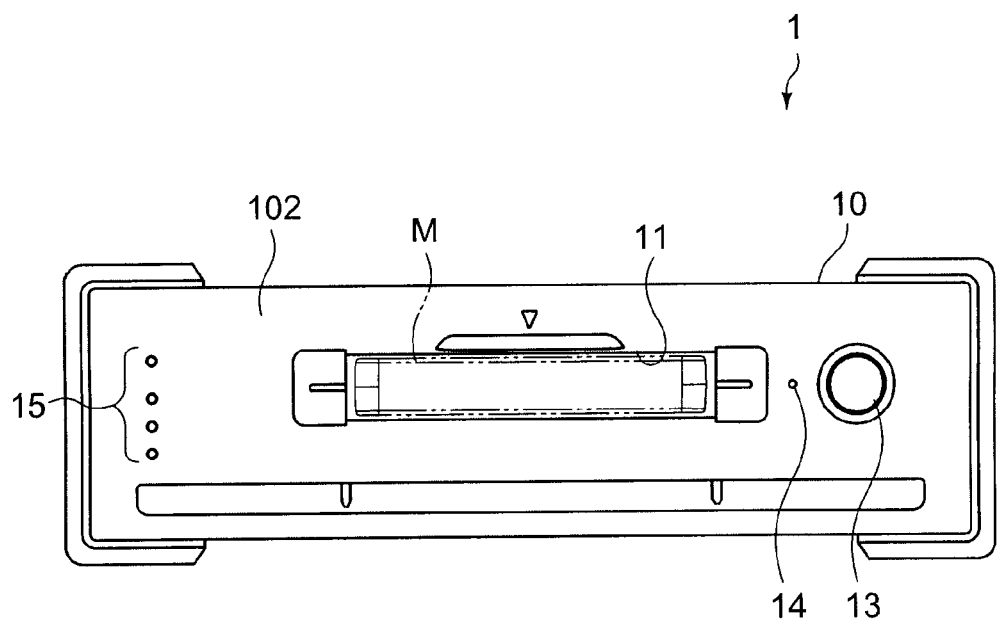
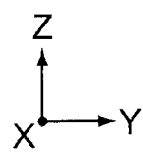
FIG.2

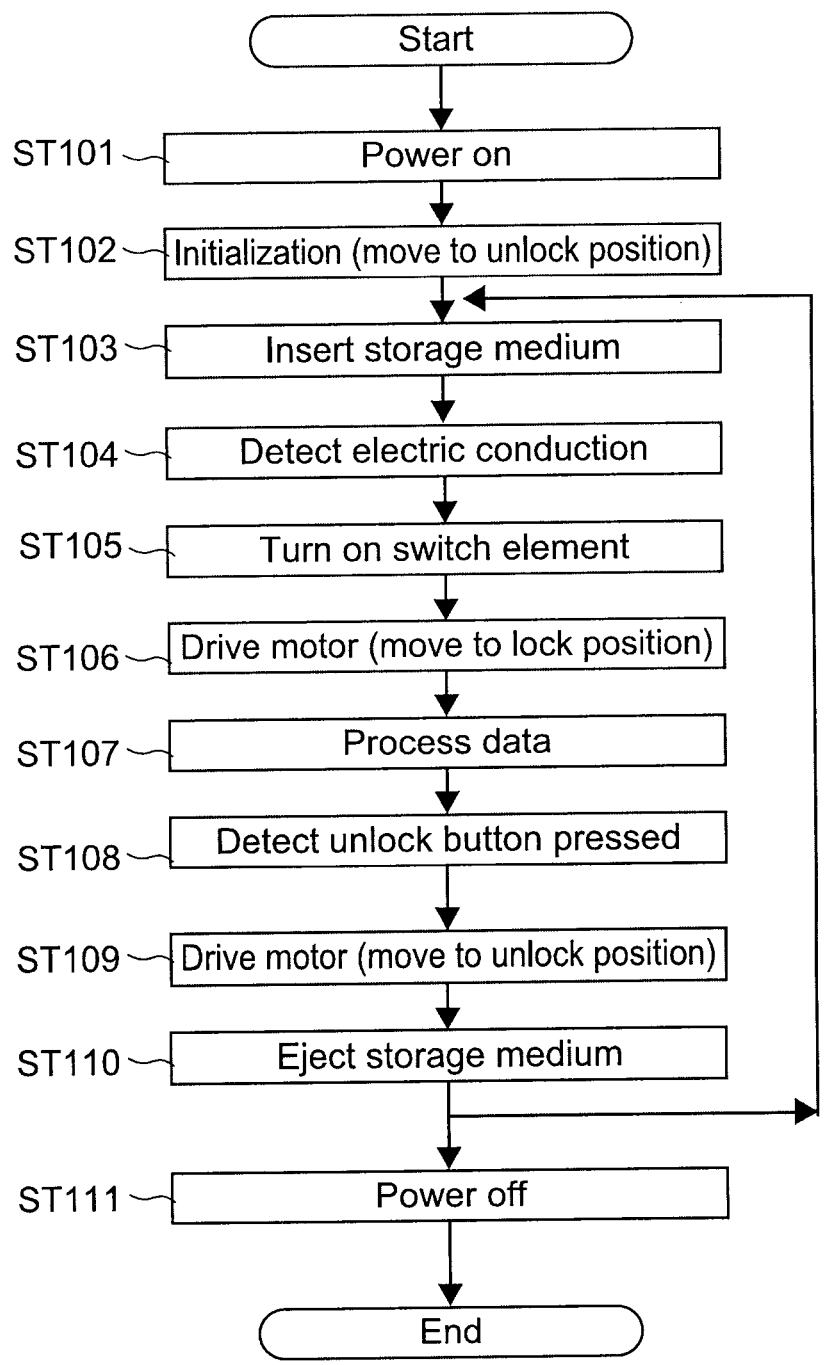

ELECTRONIC APPARATUS

BACKGROUND

The present disclosure relates to an electronic apparatus capable of preventing data from being destroyed when a storage medium is unintentionally pulled out.

In general, a storage-medium drive device is provided inside a slot formed on an electronic apparatus. Further, when a storage medium is inserted into the slot, a connection terminal of the storage medium connects with a terminal electrode of the storage-medium drive device. As a result, the electronic apparatus and the storage medium are capable of sending/receiving information signals. In such a storage-medium drive device, if a storage medium is pulled from a slot when information signals are being written in a storage medium, a memory area of the storage medium may be destroyed. As a result, information written in the storage medium may be lost. Alternatively, the storage medium may not be used after that.

In view of this, there is known an electronic apparatus including a lock mechanism, which is configured to prevent a storage medium from being pulled from a slot when information signals are being written in the storage medium. The lock mechanism is configured to lock a storage medium in a storage-medium drive device, in a state where the storage medium is mounted on the storage-medium drive device. For example, Japanese Patent Application Laid-open No. 2004-334562 describes an electronic apparatus including the following structure. That is, in a state where a storage medium is mounted on a storage-medium drive device, an electromagnetic actuator actuates a lock member such that the lock member engages with an engagement concave portion of the storage medium. As a result, a lock status is established.

SUMMARY

However, the structure, in which a storage medium is mechanically positioned, may cause relative movement between the storage medium and an electronic apparatus within a shape tolerance of the lock member, within a shape tolerance of the engagement concave portion, or within a positional tolerance between the engagement concave portion and the lock member. Because of this, if a position, at which a storage medium is electrically disconnected from an electronic apparatus, is in the tolerance range, information written in the storage medium may be lost. Alternatively, the storage medium may not be used after that.

In view of the above-mentioned circumstances, it is desirable to provide an electronic apparatus capable of preventing data from being destroyed when a storage medium is unintentionally pulled out.

According to an embodiment of the present technology, there is provided An electronic apparatus including a connector configured to electrically connect with a terminal of a second electronic device; a first detector configured to detect an electrical connection between the connector and the terminal; a second detector configured to detect physical contact between the connector and the terminal; and circuitry configured to control a lock structure based on outputs of the first and second detectors.

The electronic device may further include a main case; and a front panel attached to the main case, wherein the front panel includes a slot in which the second electronic device is inserted. The electronic device may also include an unlock button disposed on the front panel, wherein the circuitry is configured to control the lock structure to be in an unlocked state when an input is received at the unlock button.

The electronic apparatus may further include the lock structure configured to lock or unlock the second electronic device to the connector based on a control signal output by the circuitry. The lock structure may include the lock structure includes an arm member that is configured to move between a lock position and an unlock position based on a control signal received from the circuitry.

The first detector may be configured to detect whether electricity is conducted between connector and the terminal. The first detector may also be configured to output a detection signal generated based on whether electricity is conducted between connector and the terminal.

The second detector may include a switch element disposed in the slot and configured to be actuated when the second electronic device is inserted into the slot. The second detector may also be configured to output a detection signal generated based on an actuation status of the switch.

According to another exemplary embodiment, the disclosure is directed to a method performed by an electronic apparatus, the method comprising: detecting an electrical connection between a connector of the electronic apparatus and a terminal of a second electronic device; detecting physical contact between the connector and the terminal; and controlling a lock structure based on outputs of the first and second detectors.

According to another exemplary embodiment, the disclosure is directed to a non-transitory computer-readable medium including computer program instructions, which, when executed by an electronic apparatus, cause the electronic apparatus to perform a process comprising: detecting an electrical connection between a connector of the electronic apparatus and a terminal of a second electronic device; detecting physical contact between the connector and the terminal; and controlling a lock structure based on outputs of the first and second detectors.

As described above, according to the present technology, it is possible to prevent data from being destroyed when a storage medium is unintentionally pulled out.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 2 is a front view showing main part of the electronic apparatus;

FIG. 13 is a flowchart showing an example of how the electronic apparatus is operated and an example of how a controller unit works.

DETAILED DESCRIPTION OF EMBODIMENTS

Hereinafter, an embodiment of the present disclosure will be described with reference to the drawings.

[Entire Structure of Electronic Apparatus]

Figure 1:
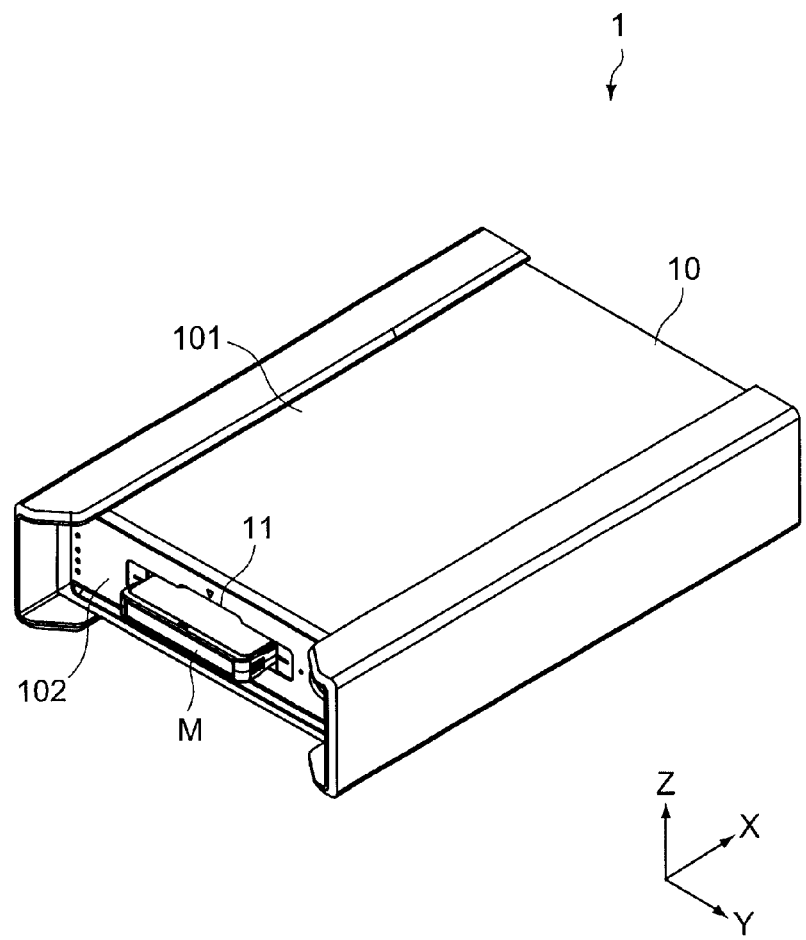
FIG. 1 is a perspective view showing an entire structure of an electronic apparatus according to an embodiment of the present technology.

FIG. 1 is a perspective view showing the entire structure of an electronic apparatus according to an embodiment of the present technology. FIG. 2 is a front view showing main part of the electronic apparatus. In the drawings, the X-axis direction and the Y-axis direction show horizontal directions orthogonal to each other. The Z-axis direction shows the vertical direction.

Figure 4:
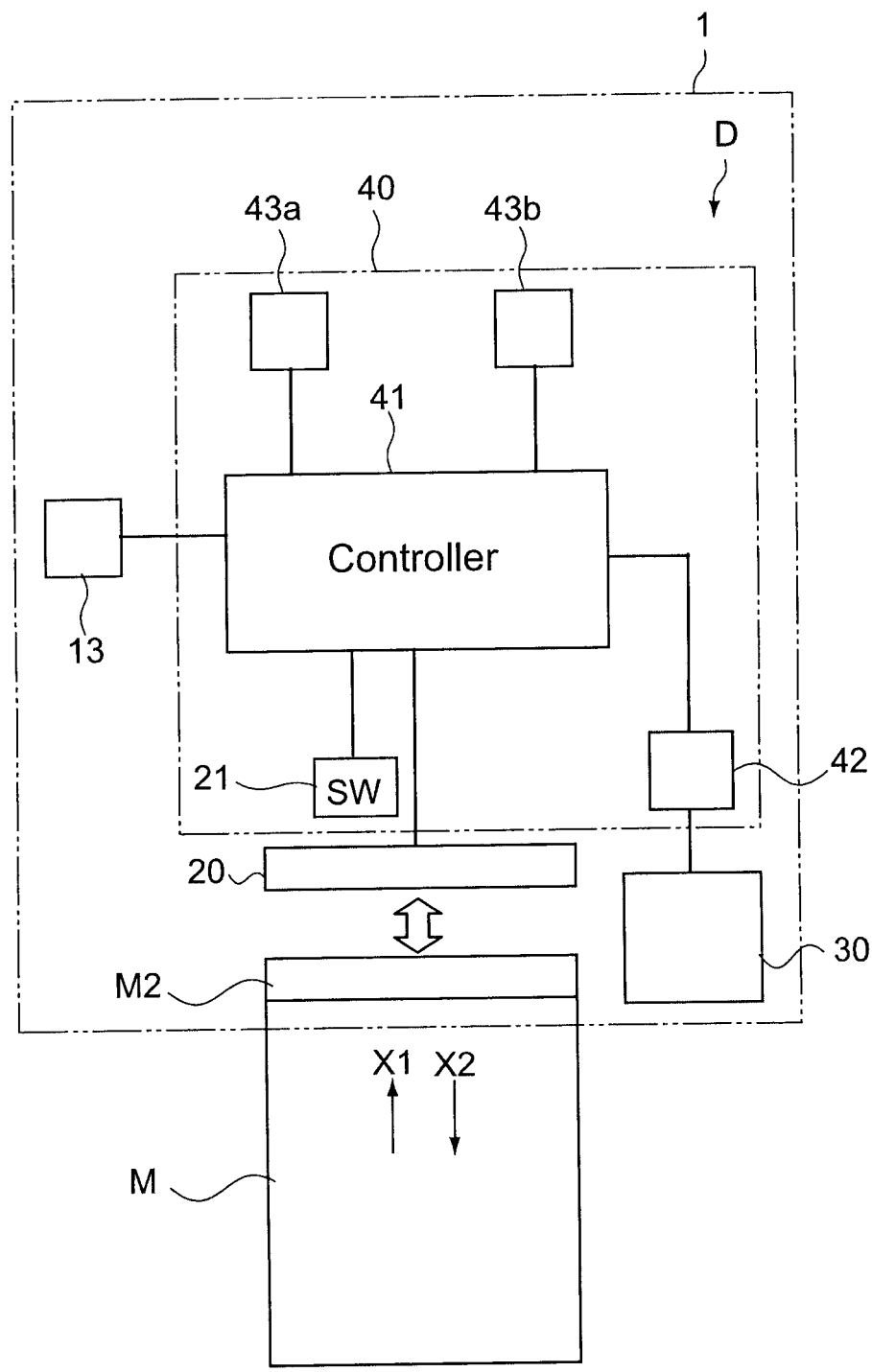
FIG. 4 is a structural diagram schematically showing a built-in drive device in the electronic apparatus.

An electronic apparatus 1 of this embodiment includes a case 10 and a drive device D (see FIG. 4). The case 10 includes an insertion slot 11. A storage medium M is inserted into the insertion slot 11. The drive device D is provided inside the case 10. The electronic apparatus 1 functions as a data processing apparatus configured to process data stored in the storage medium M. The electronic apparatus 1 of this embodiment is connected to an information processing apparatus (not shown), for example. The electronic apparatus 1 functions as a data transfer apparatus configured to transfer data, which is read from the storage medium M, to the information processing apparatus.

The case 10 includes a rectangular-parallelepiped main case 101 and a front panel 102. The main case 101 has a front opening. The front panel 102 is attached to the front of the main case 101. The insertion slot 11 is formed on the front panel 102. An unlock button 13 (first button) is arranged in the vicinity of the insertion slot 11 of the front panel 102. The unlock button 13 (first button) is pressed when the storage medium M is to be ejected.

The insertion slot 11 is a slot having a longitudinal direction in the Y-axis direction. The storage medium M is inserted into the insertion slot 11 in the X-axis direction, and is ejected from the insertion slot 11. A user presses the unlock button 13, and then pulls the storage medium M. As a result, the storage medium M is ejected from the insertion slot 11. How to eject the storage medium M from the insertion slot 11 will be described later in detail. In this case, part of the back end of the storage medium M, which is inserted into the insertion slot 11, partially protrudes from the front panel 102. Because of this, a user may eject the storage medium M easily.

An emergency button 14 (second button), a display unit 15, and the like are arranged on the front panel 102. The display unit 15 displays various operating statuses of the electronic apparatus 1. The emergency button 14 is pressed when the storage medium M is to be ejected from the insertion slot 11, in a state where the electronic apparatus 1 is powered off. The emergency button 14 will be described later in detail. The display unit 15 includes a plurality of LEDs (Light Emitting Diodes) as light sources. The display unit 15 is configured to blink at predetermined light-emitting patterns to show operating statuses (status, network connection status, and the like) of the electronic apparatus 1. Note that the above-mentioned information processing apparatus supplies power to the electronic apparatus 1. Alternatively, a button for independently supplying power to the electronic apparatus 1 may be arranged on the front panel 102.

As shown in FIG. 1, the electronic apparatus 1 is installed such that the longitudinal direction of the front panel 102 is in parallel with the Y-axis direction. Alternatively, the electronic apparatus 1 may be installed such that the longitudinal direction of the front panel 102 is in parallel with the vertical direction (Z-axis direction).

[Storage Medium]

Figure 3:
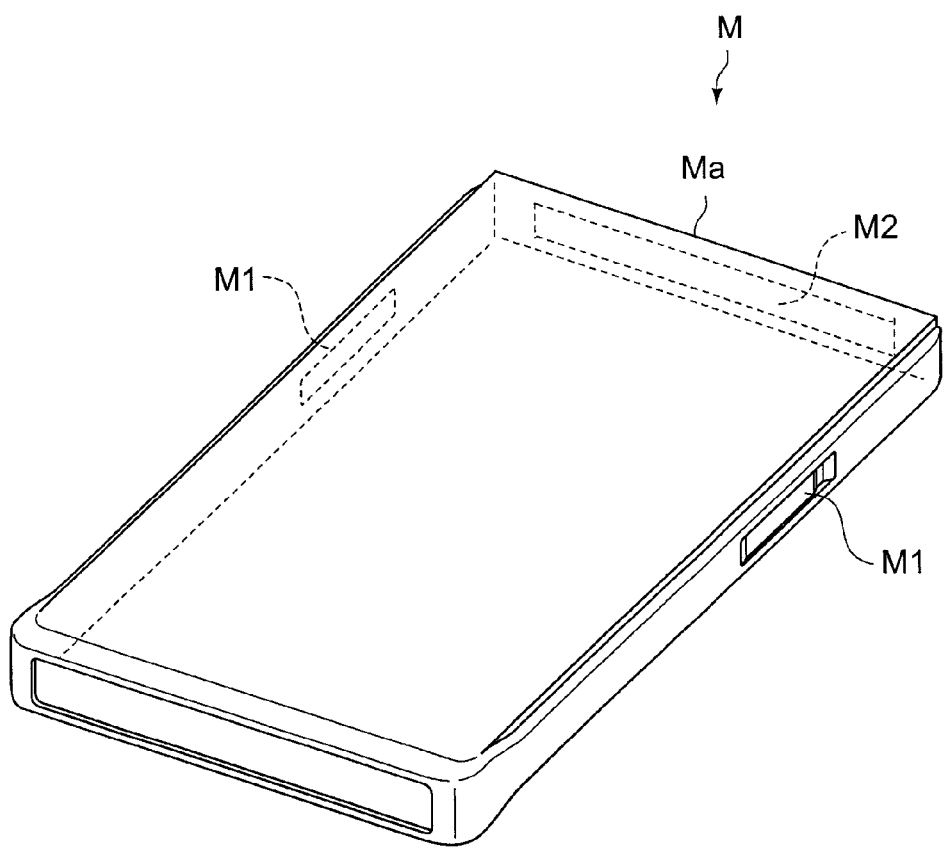
FIG. 3 is a perspective view showing an entire storage medium used for the electronic apparatus.

FIG. 3 is a perspective view showing the entire storage medium M.

The storage medium M includes a built-in semiconductor memory having a predetermined capacity (for example, 256 GB). The storage medium M is a plate-like package memory. The storage medium M includes engagement parts M1 and a connection terminal M2 on its outer surfaces. The storage medium M is used as a removal storage medium for storing materials to be broadcasted, for example. The storage medium M stores image data picked up by an image-pickup camera (not shown).

The engagement parts M1 are concaves or grooves, which are formed at predetermined positions on both of the side surfaces of the storage medium M, respectively. In this example, the engagement parts M1 are formed on both of the side surfaces of the storage medium. Alternatively, the engagement part M1 may be formed on one side surface.

The connection terminal M2 includes a plurality of connecting pins. The plurality of connecting pins are formed on an insertion end (end portion) Ma of the storage medium M. The storage medium M is inserted into the insertion slot 11. As a result, the connection terminal M2 is electrically connected to the drive device D, which is arranged inside the electronic apparatus 1.

[Drive Device]

Next, the drive device D will be described in detail.

FIG. 4 is a structural diagram schematically showing the drive device D of this embodiment. The drive device D includes a terminal electrode 20, a lock mechanism 30, a controller unit 40.

The terminal electrode 20 is arranged inside the case 10. The terminal electrode 20 is capable of engaging with the connection terminal M2 of the storage medium M. The storage medium M is inserted into the insertion slot 11 in an X1 direction (first direction). The terminal electrode 20 is electrically connected to a controller 41 of the controller unit 40.

The lock mechanism 30 prevents the storage medium M, which is inserted into the insertion slot 11, from being pulled out unintentionally. That is, the lock mechanism 30 is configured to, in the state where the connection terminal M2 of the storage medium M is connected to the terminal electrode 20, prevent the storage medium M from being pulled out by a user from the insertion slot 11, in a case where the storage medium M has not received a predetermined unlock operation.

The lock mechanism 30 includes an arm member. The arm member is capable of moving between a lock position and an unlock position in response to instructions from the controller 41. The arm member at the lock position engages with the engagement part M1 of the storage medium M. The lock mechanism 30 restricts the storage medium M from moving in an X2 direction, which is opposite to the X1 direction.

The controller unit 40 includes the controller 41 (controller), a switch element 21, a driver 42 for driving the lock mechanism 30, a lock position sensor 43a, and an unlock position sensor 43b. The controller 41 controls the driver 42 in response to outputs from the unlock button 13, the lock position sensor 43a, and the unlock position sensor 43b. The controller 41 is configured to switch between a lock status and an unlock status of the storage medium M by means of the lock mechanism 30 mainly based on electric conduction statuses between the terminal electrode 20 and the storage medium M, on open/close statuses of the switch element 21, and on input operations into the unlock button 13.

Figure 5:
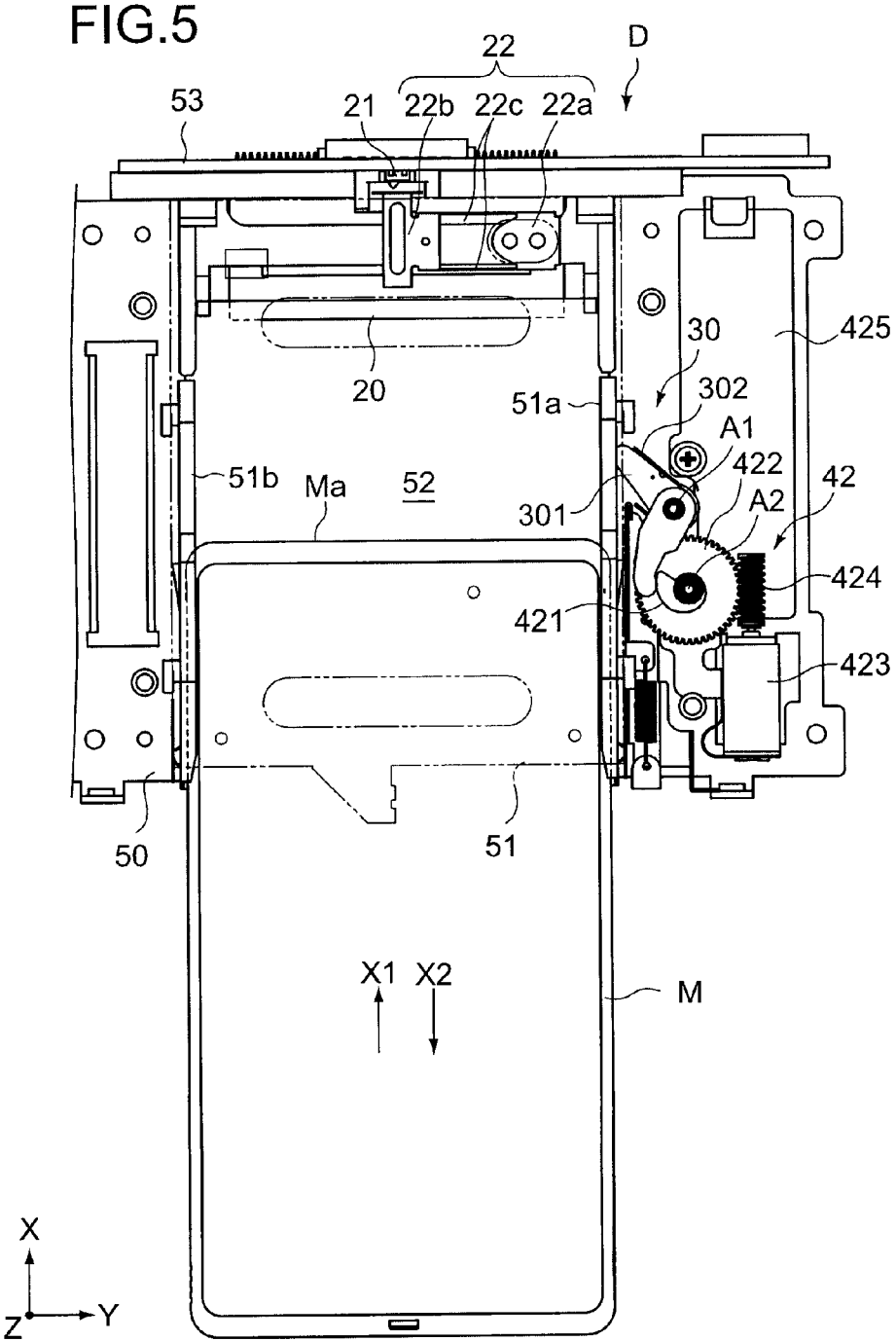
FIG. 5 is a plan view showing an example of the structure of the drive device.

Next, the drive device D will be described in detail with reference to FIG. 5. FIG. 5 is a plan view showing the structure of the drive device D seen in the Z-axis direction.

The drive device D includes a base plate 50, the terminal electrode 20, and a holder 51. The base plate 50 is made of metal. The base plate 50 is fixed to the inside of the case 10. The terminal electrode 20 is fixed to the base plate 50. The holder 51 is mounted on the base plate 50. The holder 51 includes a path 52 inside. The insertion slot 11 is in communication with the terminal electrode 20 via the path 52. The storage medium M is inserted into the insertion slot 11. The holder 51 guides the connection terminal M2 of the storage medium M to a position, at which the connection terminal M2 connects with the terminal electrode 20, through the path 52.

The interior space (path 52) of the holder 51 functions as an accommodating portion having a width and a thickness slightly larger than the width and the thickness of the storage medium M. The interior space (path 52) holds the storage medium M, which is accommodated in the path 52 and is connected to the terminal electrode 20. The holder 51 includes a pair of side walls 51a, 51b. The side walls 51a, 51b face both of the side surfaces of the storage medium M, respectively. The side walls 51a, 51b restrict the storage medium M in the path 52 from moving in the width direction (Y-axis direction of FIG. 5). The terminal electrode 20 is fixed on the base plate 50 such that the terminal electrode 20 faces the connection terminal M2 of the storage medium M. The terminal electrode 20 is mounted on a circuit board 53, which is electrically connected to the controller 41 (FIG. 4).

(Lock Mechanism)

The lock mechanism 30 is arranged between the insertion slot 11 and the terminal electrode 20. In this embodiment, the lock mechanism 30 is mounted on the base plate 50, and is arranged outside of the side wall 51a of the holder 51. The lock mechanism 30 includes an arm member 301 and a biasing member 302.

The arm member 301 is capable of moving between a lock position and an unlock position. At the lock position, the arm member 301 is capable of engaging with the engagement part M1 of the storage medium M. At the unlock position, the arm member 301 does not engage with the engagement part M1. In this embodiment, a supporting shaft A1 (rotation shaft) supports the arm member 301. The arm member 301 is configured to freely rotate between the lock position and the unlock position. The biasing member 302 is a member having elasticity. The biasing member 302 biases the arm member 301 toward the lock position. In this embodiment, the biasing member 302 is a torsion spring.

(Driver)

The driver 42 includes a cam 421, a motor 423, and a motor circuit board 425. The cam 421 is capable of engaging with the arm member 301. The motor 423 rotates the cam 421 in the anticlockwise direction of FIG. 5. The motor circuit board 425 is configured to drive the motor 423. The cam 421 is formed on one surface of the gear 422, which is supported by a supporting shaft A2. The cam 421 is capable of engaging with the arm member 301 in a case where the gear 422 is at a predetermined rotation position.

The motor 423 has a rotation shaft. A worm gear 424 is mounted on the rotation shaft. The worm gear 424 engages with the gear 422. Various circuit components are mounted on the motor circuit board 425. The circuit components are electrically connected to the motor 423 and the controller 41 (FIG. 4). The circuit components are configured to generate drive signals, which are output to the motor 423 in response to control signals from the controller 41.

Figure 6:
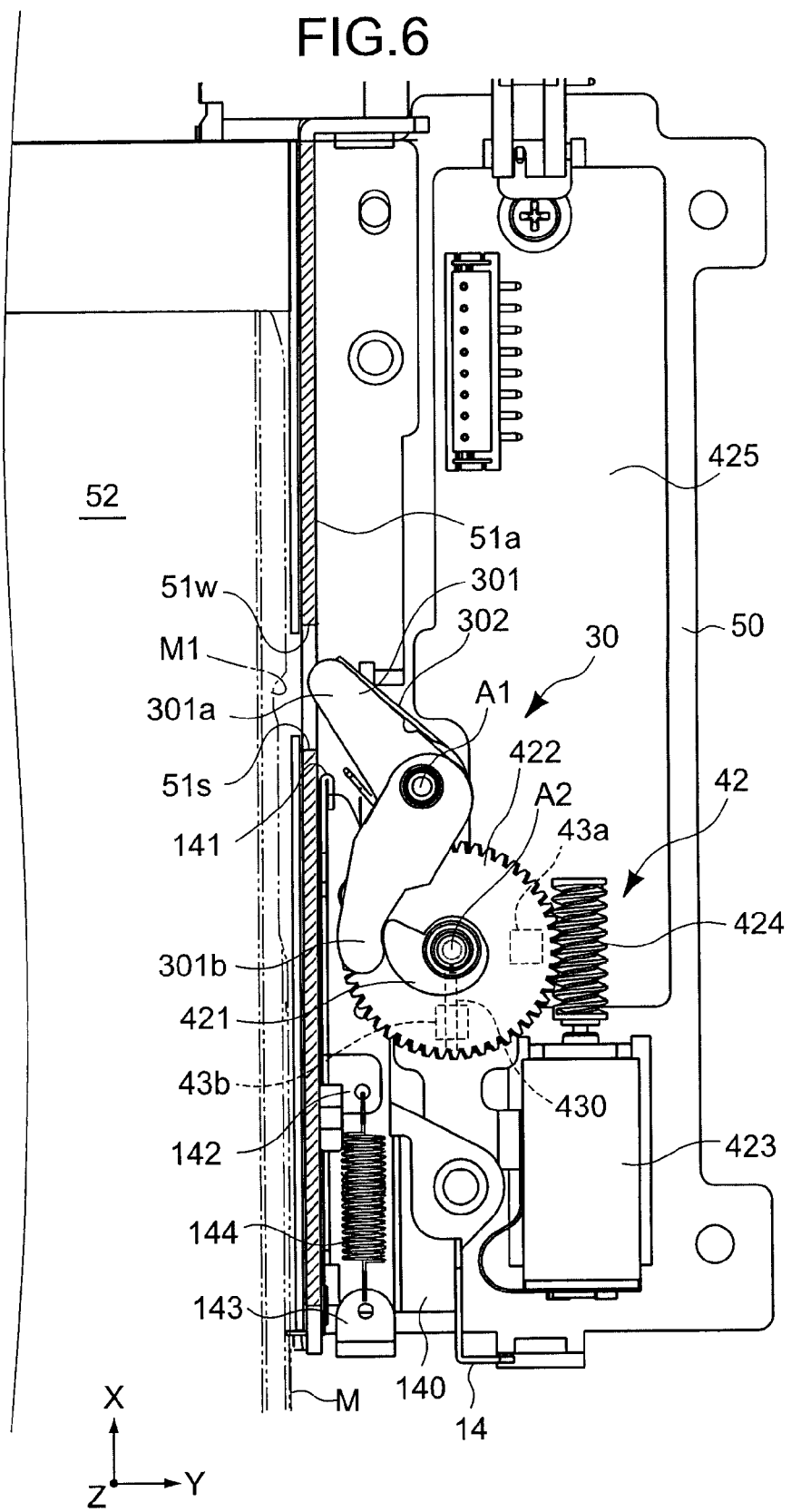
FIG. 6 is an enlarged view showing the structure of a lock mechanism of the drive device and the vicinity thereof, specifically, is a plan view showing a state where an arm member is at an unlock position.
Figure 7:
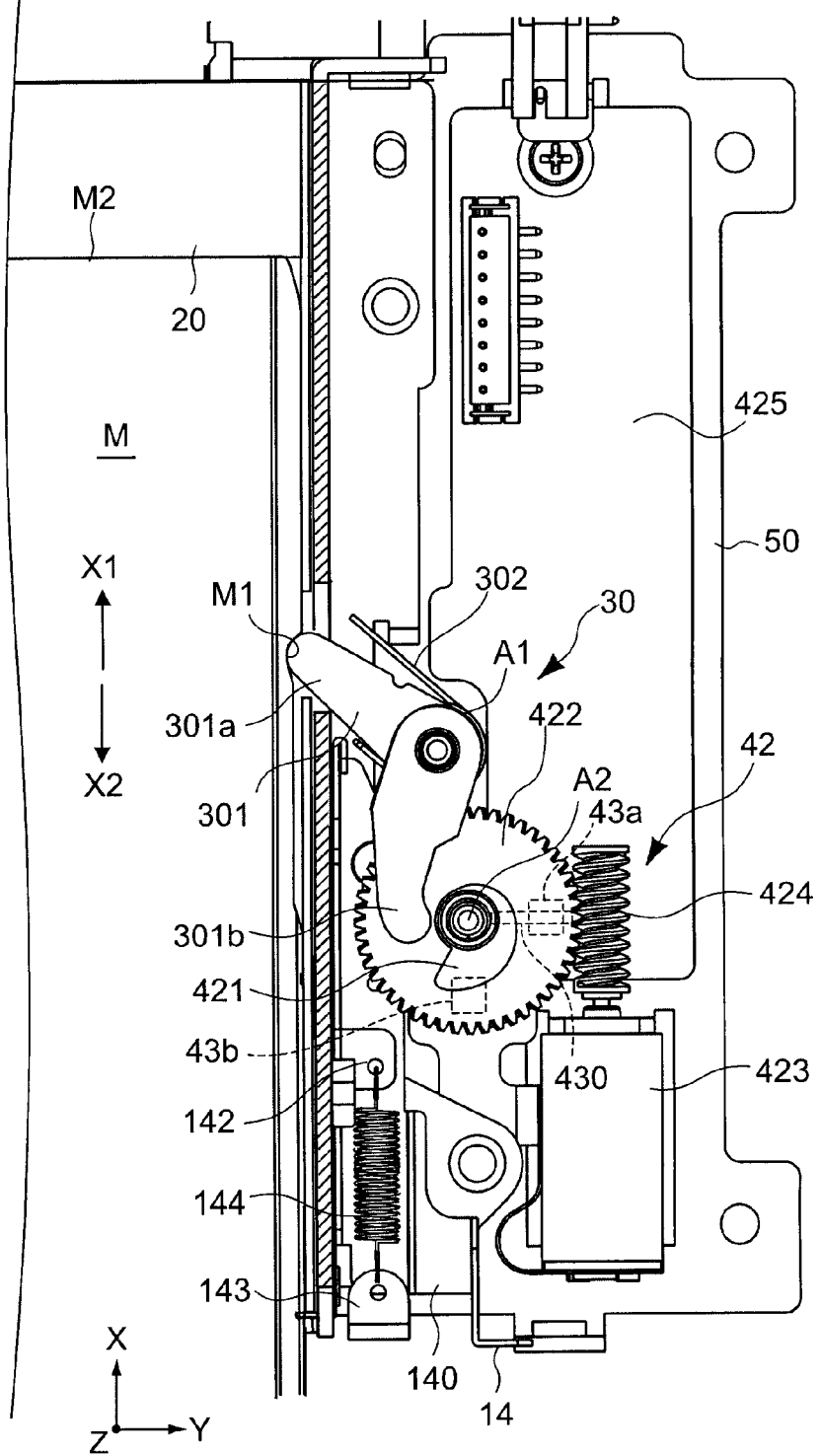
FIG. 7 is an enlarged view showing the structure of the lock mechanism of the drive device and the vicinity thereof, specifically, is a plan view showing a state where the arm member is at a lock position.
Figure 8:
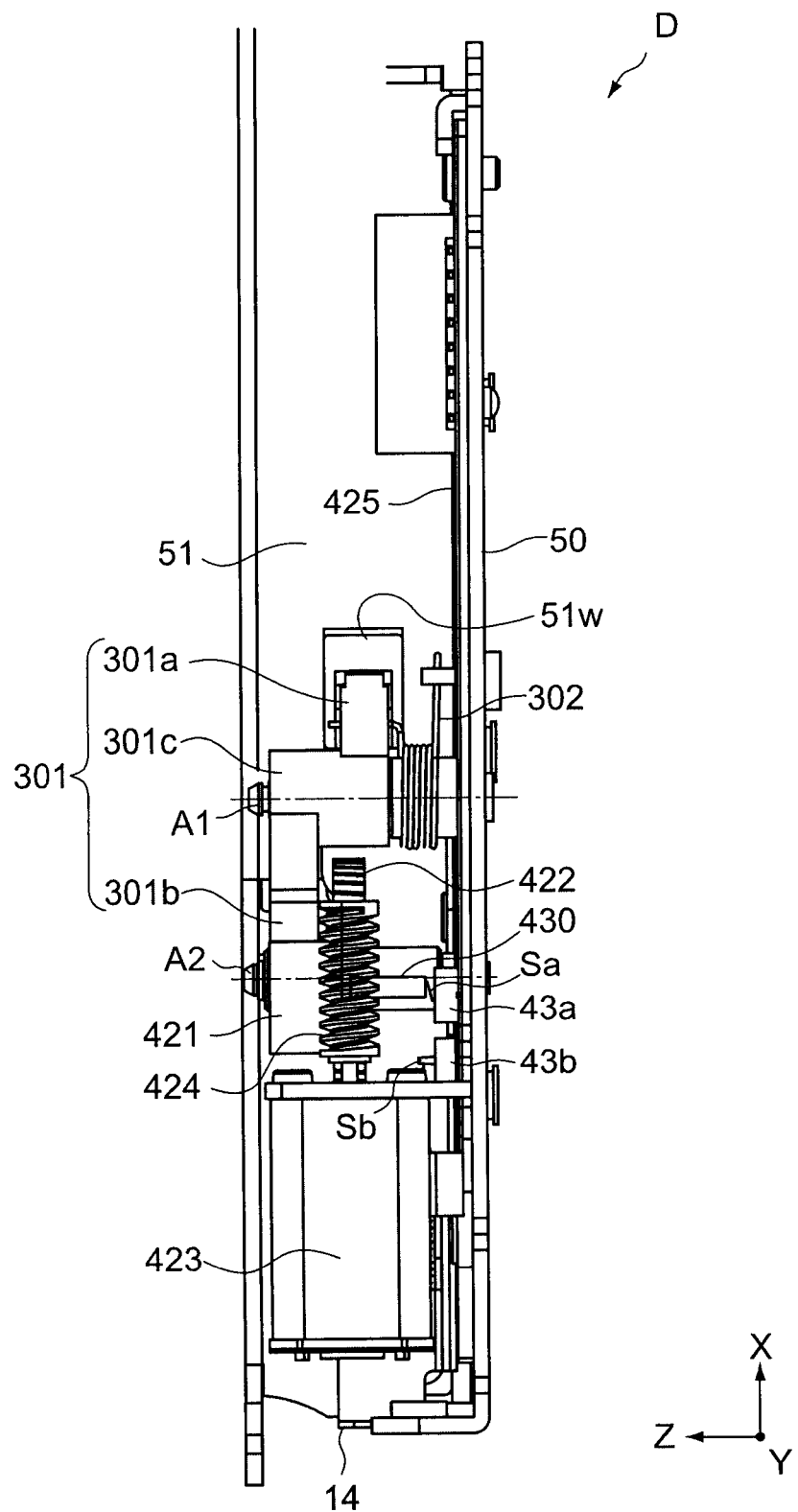
FIG. 8 is a side view showing the drive device of FIG. 6.

FIG. 6 and FIG. 7 are enlarged views showing the lock mechanism 30 and the driver 42 in detail. FIG. 6 shows a state where the arm member 301 is at the unlock position. FIG. 7 shows a state where the arm member 301 is at the lock position. FIG. 8 is a side view showing the lock mechanism 30 and the driver 42 of FIG. 7 seen in the Y-axis direction.

The arm member 301 includes a first arm 301a, a second arm 301b, and a connector 301c. The connector 301c connects the first arm 301a and the second arm 301b. The connector 301c is rotatably mounted on the supporting shaft A1. The first arm 301a rotates around the supporting shaft A1 such that the first arm 301a moves between a lock position and an unlock position. At the lock position, the first arm 301a protrudes inside the path 52 through an opening 51w, which is formed on the side wall 51a of the holder 51. At the unlock position, the first arm 301a is outside of the path 52. The second arm 301b extends to a position, at which the second arm 301b is capable of engaging with the cam 421. The second arm 301b engages with the cam 421. The cam 421 rotates in the anticlockwise direction of FIG. 6. As a result, the second arm 301b rotates the first arm 301a via the connector 301c.

One end of the biasing member 302 engages with an appropriate position on the base plate 50. The other end of the biasing member 302 engages with the first arm 301a. As a result, the biasing member 302 always biases the arm member 301 toward the lock position. The first arm 301a abuts on an end 51s of the opening 51w, which is formed on the side wall 51a of the holder 51. Because of this, the protrusion length of the first arm 301a toward the path 52 side is limited.

The gear 422 is arranged between the second arm 301b of the arm member 301 and the base plate 50. The gear 422 is rotatably mounted on the supporting shaft A2. The cam 421 is integrally formed on one surface of the gear 422. An operation plate 430 is formed on the other surface of the gear 422 such that the operation plate 430 protrudes toward the base plate 50 side. The operation plate 430 is capable of operating the lock position sensor 43a and the unlock position sensor 43b, which are mounted on the motor circuit board 425. The operation plate 430 has the length approximately the same as the radius of the gear 422. The operation plate 430 rotates around the supporting shaft A2 together with the gear 422.

The lock position sensor 43a and the unlock position sensor 43b are arranged between the gear 422 and the base plate 50. As shown in FIG. 8, the lock position sensor 43a includes an operation piece Sa, and the unlock position sensor 43b includes an operation piece Sb. The operation pieces Sa, Sb are capable of engaging with the operation plate 430 of the gear 422. The operation plate 430 engages with the operation pieces Sa, Sb, and thus mechanically presses the operation pieces Sa, Sb. As a result, the operation pieces Sa, Sb are configured to output predetermined signals.

The lock position sensor 43a and the unlock position sensor 43b are configured to detect rotation positions of the cam 421. The lock position sensor 43a faces the operation plate 430 when the gear 422 is at a rotation position, at which the arm member 301 is at the lock position (FIG. 7). Meanwhile, the unlock position sensor 43b faces the operation plate 430 when the gear 422 is at a rotation position, at which the arm member 301 is at the unlock position (FIG. 6).

The drive device D further includes a push plate 140. The push plate 140 is arranged outside of the side wall 51a of the holder 51, and is arranged between the gear 422 and the base plate 50. The push plate 140 is capable of moving in the X-axis direction along the outer surface of the side wall 51a. A front end 141 (FIG. 6) of the push plate 140 faces the first arm 301a of the arm member 301. A back end of the push plate 140 functions as the emergency button 14, which faces the front panel 102.

A first holder 142 is formed on the push plate 140. One end of a coil spring 144 engages with the first holder 142. A second holder 143 is formed on the base plate 50. The other end of the coil spring 144 engages with the second holder 143. The coil spring 144 biases the push plate 140 toward a standby position (see FIG. 6). Normally, the push plate 140 is withdrawn at a position where the front end 141 of the push plate 140 does not contact the arm member 301 (FIG. 6 and FIG. 7).

Figure 9:
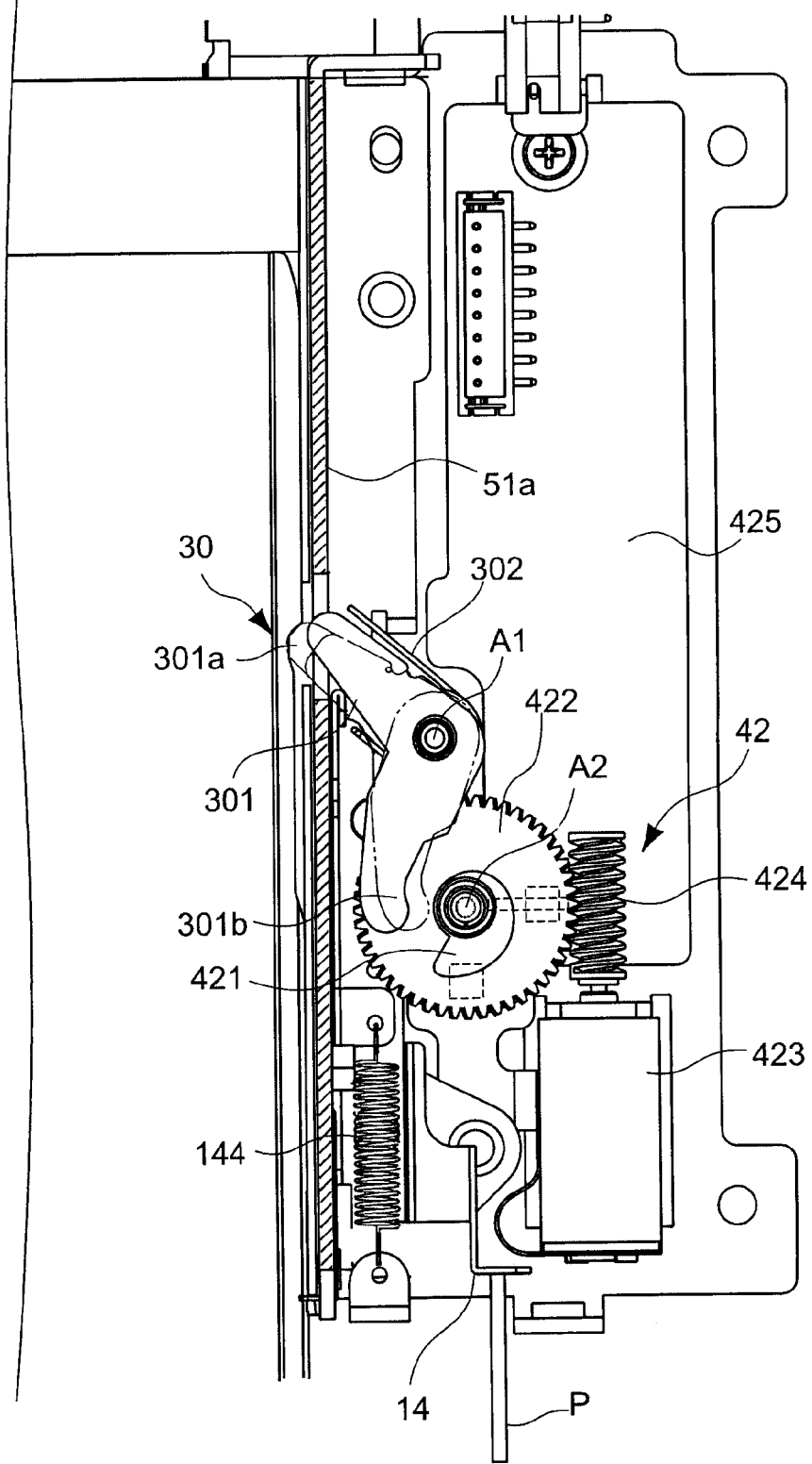
FIG. 9 is an enlarged view of main part of the drive device, for explaining an example of an unlock operation to the storage medium.

Meanwhile, a predetermined pressure piece P presses the emergency button 14. As a result, the push plate 140 moves against a biasing force of the coil spring 144 in the X1 direction. FIG. 9 is an enlarged view showing the lock mechanism 30 when the emergency button 14 is pressed. In this case, the front end 141 of the push plate 140 presses the first arm 301a, which is at the lock position, in the X1 direction (see FIG. 7). As a result, the first arm 301a mechanically moves from the lock position to the unlock position side.

As described above, the electronic apparatus 1 of this embodiment is capable of unlocking the lock status of the storage medium M also when the emergency button 14 is operated. In general, the emergency button 14 is arranged below the front surface of the front panel 102, i.e., inside the apparatus. Because of this, it is possible to prevent the storage medium M from being ejected unintentionally. Further, the emergency button 14 is configured to be operated by using a relatively fine piece such as a pin. Because of this, the emergency button 14 is not operated with a finger. As described above, the emergency button 14 is not used under the normal condition. The emergency button 14 is used when the apparatus is out of control for any reason and when the normal unlock operation is invalid.

(Controller Unit)

The controller unit 40 includes a first detection mechanism, a second detection mechanism, and a driver mechanism. The first detection mechanism detects electric conduction between the terminal electrode 20 and the storage medium M when the storage medium M is at a first position. An engagement length of engagement between the connection terminal M2 and the terminal electrode 20 in the X1 direction is a first engagement length when the storage medium M is at the first position. The second detection mechanism detects that the terminal electrode 20 mechanically contacts the storage medium M when the storage medium M is at a second position. An engagement length of engagement between the connection terminal M2 and the terminal electrode 20 is a second engagement length when the storage medium M is at the second position. The second engagement length is larger than the first engagement length. The driver mechanism moves the arm member 301 from the unlock position to the lock position when the first detection mechanism detects electric conduction between the terminal electrode 20 and the storage medium M, and when the second detection mechanism detects that the terminal electrode 20 mechanically contacts the storage medium M. After the controller unit 40 moves the arm member 301 to the lock position, the controller unit 40 reads information from the storage medium M or writes information in the storage medium M (hereinafter, collectively referred to as "data processing".).

In this embodiment, the first detection mechanism mainly includes the controller 41. The second detection mechanism includes the switch element 21, an operation piece 22, and the controller 41. The driver mechanism includes the driver 42.

As shown in FIG. 5, the switch element 21 is mounted on the circuit board 53 such that the switch element 21 faces an end Ma of the storage medium M, which is inserted into the insertion slot 11, in the X-axis direction. The switch element 21 is a microswitch. The switch element 21 is configured to open/close operated by the operation piece 22. The operation piece 22 is arranged between the switch element 21 and the end portion of the storage medium M.

The operation piece 22 is arranged between the insertion slot 11 and the switch element 21. The operation piece 22 operates the switch element 21 in sync with movement of the storage medium M from the first position to the second position. Because of this, the switch element 21 is capable of detecting the inserted storage medium M at the second position.

The operation piece 22 is fixed on an inner-surface side of a top wall of the holder 51. The operation piece 22 is formed by bending a plate spring such that the plate spring has a predetermined shape. The operation piece 22 includes a fixed end 22a and a free end 22b. The fixed end 22a is fixed on the holder 51. The free end 22b is capable of elastically deforming when the free end 22b contacts the end Ma of the storage medium M. Two arms 22c connect the fixed end 22a and the free end 22b such that the free end 22b is capable of elastically deforming in the X-axis direction.

Figure 10:
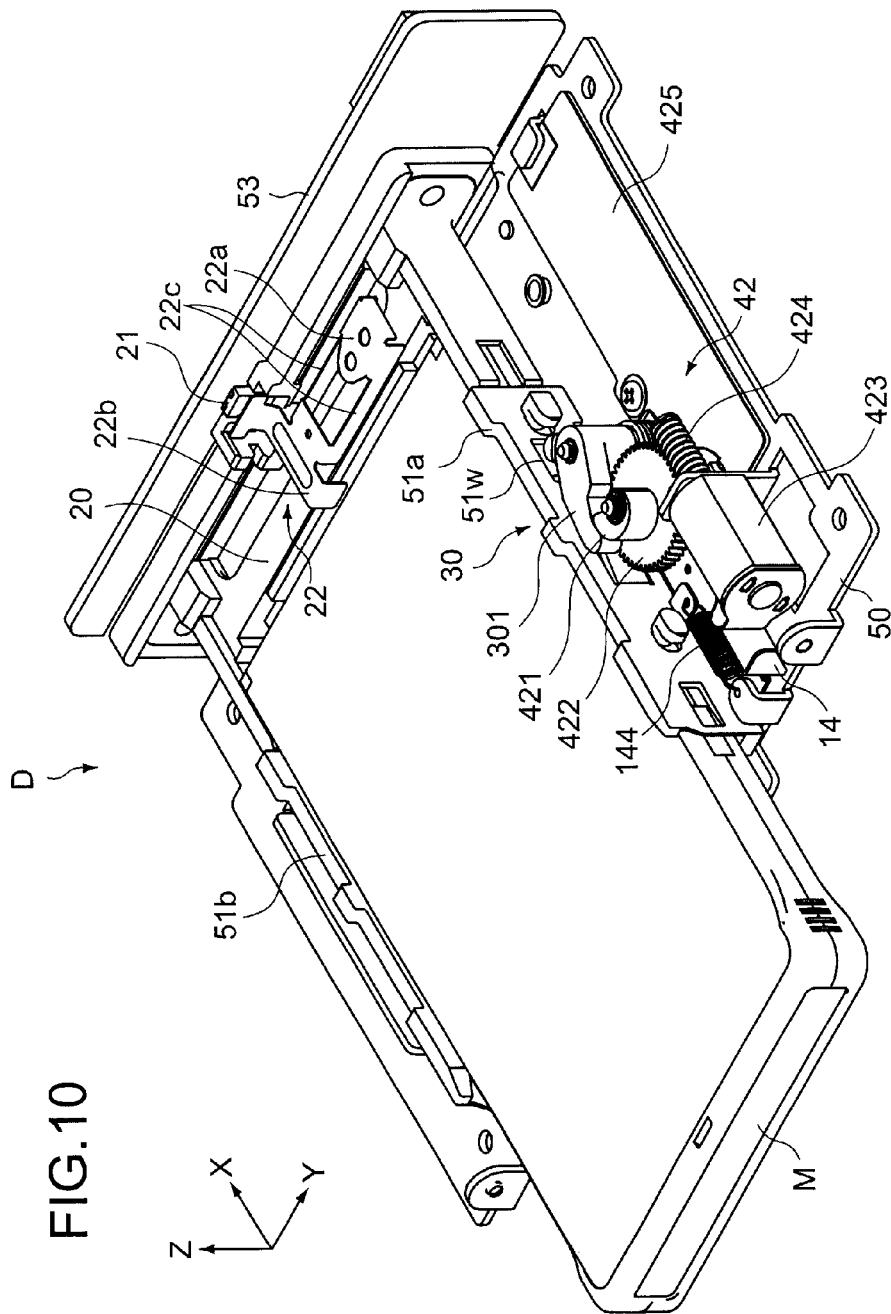
FIG. 10 is a perspective view showing a state where a storage medium is inserted in the drive device.
Figure 11:
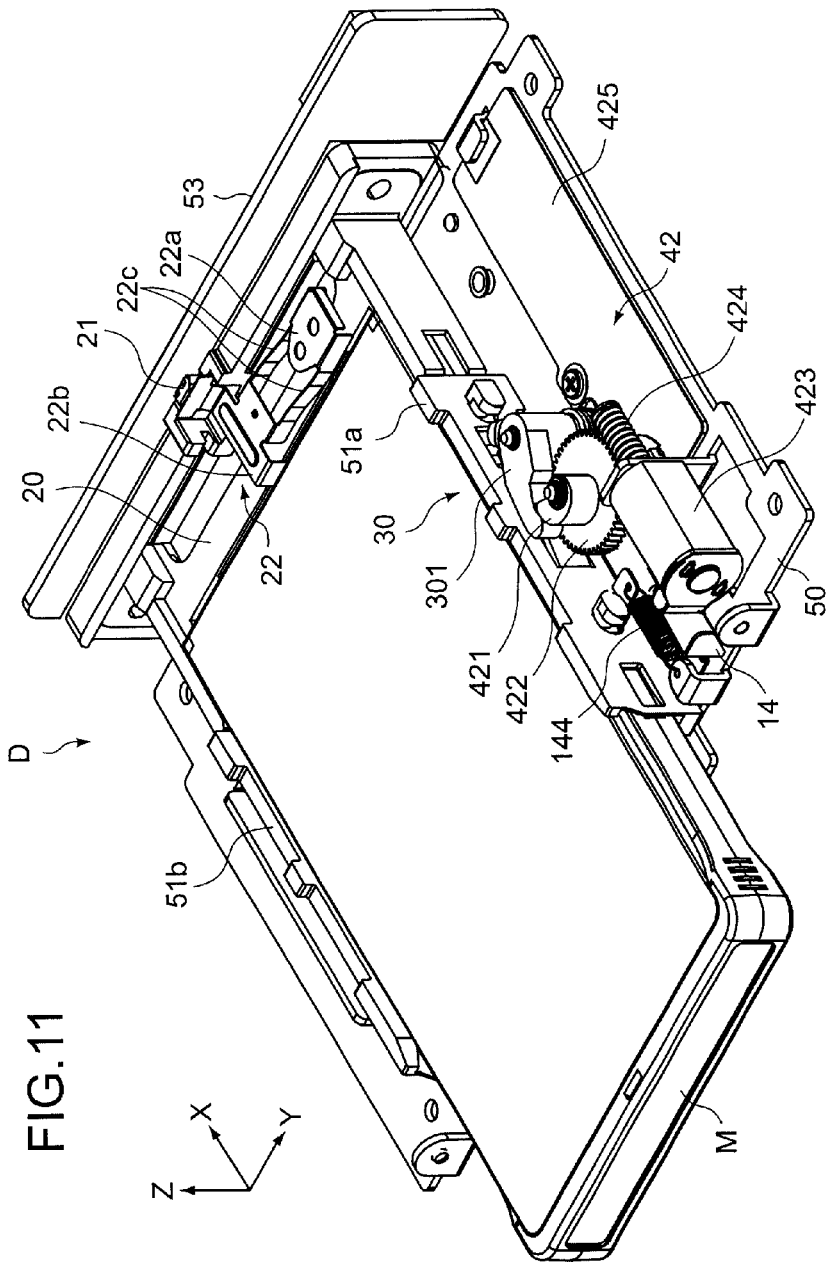
FIG. 11 is a perspective view showing a state where mechanical contact between the drive device and the storage medium is detected.
Figure 12A:
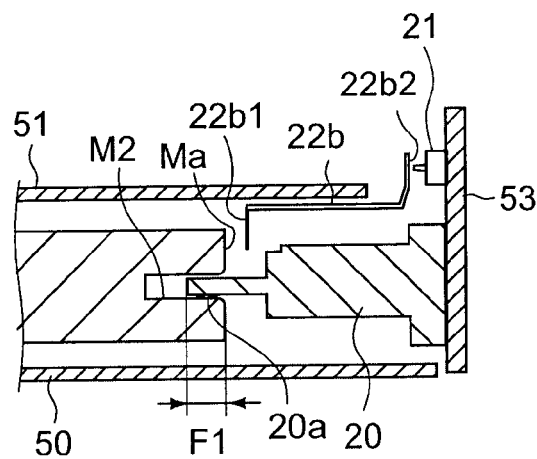
FIG. 12A is a side view schematically showing a state where the storage medium engages with the terminal electrode of the drive device, the engagement length being a first engagement length.
Figure 12B:
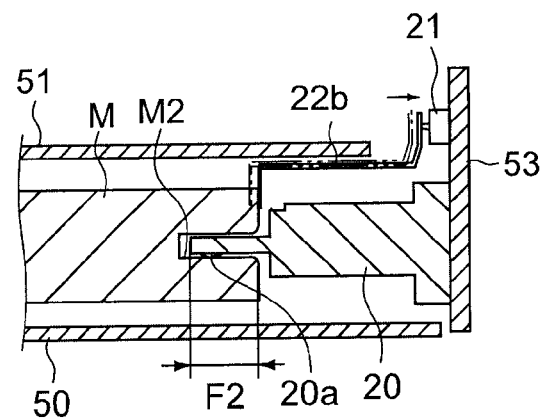
FIG. 12B is a side view schematically showing a state where the storage medium engages with the terminal electrode of the drive device, the engagement length being a second engagement length.

Each of FIG. 10 and FIG. 11 is a perspective view showing the internal structure of the main part of the drive device D. The top wall of the holder 51 is not shown in each of FIG. 10 and FIG. 11. FIG. 12A is a schematic diagram showing a relation between the switch element 21, which is turned off, and the engagement length of engagement between the terminal electrode 20 and the connection terminal M2. FIG. 12B is a schematic diagram showing a relation between the switch element 21, which is turned on, and the engagement length of engagement between the terminal electrode 20 and the connection terminal M2.

The operation piece 22 is arranged between the end Ma of the storage medium M and the switch element 21. As shown in FIG. 12A, the operation piece 22 includes a first end-strip 22b1 and a second end-strip 22b2. The first end-strip 22b1 faces the end Ma of the storage medium M. The second end-strip 22b2 faces the operation piece of the switch element 21. The end Ma of the storage medium M is inserted into the insertion slot 11, and presses the first end-strip 22b1. As a result, the arms 22c elastically deforms in an X1-axis direction, and thus the free end 22b elastically deforms in the X1-axis direction. The second end-strip 22b2 moves in the X1-axis direction, and thus operates the switch element 21 (FIG. 11 and FIG. 12B).

FIG. 12A shows the state where the storage medium M is at the first position. In FIG. 12A, the connection terminal M2 engages with the terminal electrode 20. In this case, the engagement length is a first engagement length F1. When the connection terminal M2 engages with the terminal electrode 20 and the engagement length is the first engagement length F1, an electrode 20a of the terminal electrode 20 contacts the connection terminal M2. The storage medium M electrically connects with the drive device D (electronic apparatus 1). The controller 41 always monitors electric conduction between the terminal electrode 20 and the storage medium M. The controller 41 detects electric conduction between the terminal electrode 20 and the storage medium M, which is at the first position.

The first engagement length F1 may be an engagement length of engagement between the connection terminal M2 and the electrode 20a at a time when the connection terminal M2 starts to contact the electrode 20a. Alternatively, the first engagement length F1 may be an engagement length of engagement between the connection terminal M2 and the terminal electrode 20 at a time when the connection terminal M2 further moves from the contact-start position. When the storage medium M is at the first position, the arm member 301 does not move to the lock position. Because of this, data is not processed.

FIG. 12B shows the state where the storage medium M is at the second position. In FIG. 12B, the connection terminal M2 engages with the terminal electrode 20. In this case, the engagement length is a second engagement length F2. When the connection terminal M2 engages with the terminal electrode 20 and the engagement length is the second engagement length F2, the storage medium M electrically connects with the drive device D (electronic apparatus 1), similar to the state where the storage medium M is at the first position. Further, in the state where the storage medium M is at the second position, the end Ma of the storage medium M contacts and presses the free end 22b of the operation piece 22. As a result, the operation piece 22 elastically deforms in the X1 direction. The free end 22b contacts the switch element 21, and turns on the switch element 21.

The second engagement length F2 has any length as far as the second engagement length F2 is larger than the first engagement length F1. For example, the second engagement length F2 may be determined in consideration of a stroke length until the switch element 21 is turned on. Further, the difference between the second engagement length F2 and the first engagement length F1 may be determined in consideration of, for example, a positional tolerance of the arm member 301, which engages with the engagement part M1 of the storage medium M. In other words, the positional tolerance of the arm member 301 is a minute displacement of the storage medium M in the X-axis direction, in a state where the storage medium M engages with the arm member 301, and where the storage medium M is restricted from moving.

In this embodiment, the arm member 301 is capable of engaging with the engagement part M1 in a case where the storage medium M is between the first position (FIG. 12A) and the second position (FIG. 12B). According to this structure, in a case where the storage medium M is unintentionally pulled and thus moves from the second position to the first position, the electric conduction between the connection terminal M2 and the terminal electrode 20 may be maintained stably.

The controller 41 receives a signal, which indicates that the switch element 21 is turned on. The controller 41 thus detects that the storage medium M is connected to the terminal electrode 20. Then, the controller 41 controls the driver 42 to move the arm member 301 to the lock position. As a result, the arm member 301 engages with the engagement part M1 of the storage medium M. The storage medium M is restricted from moving in the X-axis direction.

The controller 41 is configured to determine the type of the storage medium M when detecting electric conduction between the terminal electrode 20 and the storage medium M. The controller 41 is configured not to move the arm member 301 to the lock position in a case where the type is an unintended type. Because an unintended storage medium is not locked, the storage medium may be ejected right away without the need of an unlock operation.

[How Electronic Apparatus Works]

Next, how the electronic apparatus 1 typically works will be described. FIG. 13 is a flowchart showing an example of how the electronic apparatus 1 is operated and an example of how the controller unit 40 (the controller 41) works.

When the electronic apparatus 1 is powered on, the controller unit 40 drives the motor 423. The motor 423 rotates the gear 422. The gear 422 moves the arm member 301 to the unlock position (see FIG. 6) (Steps ST101, 102). The information processing apparatus as a superior apparatus may supply power to the electronic apparatus 1. Alternatively, a commercial power source may supply power to the electronic apparatus 1 via a power cord, which is attached to the electronic apparatus 1.

Based on a signal output from the unlock position sensor 43b, the controller 41 detects that the arm member 301 is at the unlock position. The unlock position sensor 43b detects that the operation plate 430 of the gear 422 presses the operation piece Sb. The unlock position sensor 43b outputs a signal and supplies the signal to the controller 41. In response to the signal output from the unlock position sensor 43b, the controller 41 stops the motor 423. As a result, the arm member 301 may move to the unlock position precisely.

In this manner, a standby status is set. In the standby status, the insertion slot 11 waits for the storage medium M to be inserted. The electronic apparatus 1 is usually initialized in this manner, irrespective of an initial position of the arm member 301. As a result, the appropriate standby status is established every time the electronic apparatus 1 is used.

The storage medium M is inserted into the insertion slot 11 (Step ST103). Then, as shown in FIG. 10, the connection terminal M2 of the storage medium M engages with the terminal electrode 20. Then, as shown in FIG. 12A, the engagement length of engagement between the terminal electrode 20 and the connection terminal M2 reaches the first engagement length F1. Then, the controller 41 detects electric conduction between the terminal electrode 20 and the storage medium M (Step ST104).

The storage medium M is further inserted. As a result, the engagement length of engagement between the terminal electrode 20 and the connection terminal M2 reaches the second engagement length F2. As shown in FIG. 11 and FIG. 12B, the operation piece 22 turns on the switch element 21 (Step ST105).

The controller 41 detects electric conduction between the terminal electrode 20 and the storage medium M when the storage medium M is at the first position. The controller 41 detects that the storage medium M mechanically contacts the switch element 21 when the storage medium M is at the second position. After that, the controller 41 drives the motor 423. The motor 423 rotates the gear 422 in the anticlockwise direction. The gear 422 moves the arm member 301 to the lock position (see FIG. 7) (Step ST106). The controller 41 detects that the arm member 301 is at the lock position based on a signal output from the lock position sensor 43a. The lock position sensor 43a detects that the operation plate 430 of the gear 422 presses the operation piece Sa. The lock position sensor 43a outputs a signal and supplies the signal to the controller 41. In response to the signal output from the lock position sensor 43a, the controller 41 stops the motor 423. As a result, the storage medium M is in the lock status. In the lock status, the storage medium M may not be pulled out in the X2 direction.

Subsequently, the controller 41 processes data in the storage medium M (Step ST107). In this embodiment, the controller 41 processes data as follows. That is, the controller 41 reads data stored in the storage medium M via the terminal electrode 20. The controller 41 transfers the read data to an information processing apparatus (not shown). Alternatively, the controller 41 outputs the read data to a display apparatus (not shown). The display apparatus (not shown) reproduces images. Alternatively, the information processing apparatus transfers information to the controller 41. The controller 41 writes the received information in the storage medium M.

After data is processed, the controller 41 detects that the unlock button 13 is pressed by a user (Step ST108). Then, the controller 41 drives the motor 423. As shown in FIG. 6, the motor 423 rotates the gear 422 around the supporting shaft A2 in the anticlockwise direction by a predetermined angle. As a result, the arm member 301 moves to the unlock position (Step ST109).

In this case, as shown in FIG. 6, the cam 421 on the gear 422 engages with the arm member 301 (specifically, second arm 301b). As a result, the arm member 301 (specifically, first arm 301a) moves to the unlock position against a biasing force of the biasing member 302. At the unlock position, the arm member 301 (specifically, first arm 301a) is outside of the side wall 51a. As a result, the storage medium M is unlocked. The storage medium may be pulled out in the X2 direction (Step ST110).

After that, if a storage medium M is inserted into the insertion slot 11 again, the above-mentioned behaviors are repeated. Further, if the electronic apparatus 1 is powered off (Step ST111), the drive device D is turned off irrespective of a position of the arm member 301.

As described above, according to this embodiment, the controller 41 detects electric conduction between the terminal electrode 20 and the storage medium M, which is at one position. The controller 41 mechanically detects the storage medium M, which is at another position. As a result, even if the storage medium relatively moves between those positions, an electronically-connected status between the storage medium M and the electronic apparatus 1 may be maintained. As a result, it is possible to prevent data stored in a medium from being destroyed even if the medium is unintentionally pulled out.

Further, according to this embodiment, the motor 423 rotationally drives only in one direction to thereby move the arm member 301 between the lock position and the unlock position. As a result, the structure may be simplified, and the controller 41 may perform simple procedures.

It should be understood by those skilled in the art that various modifications, combinations, sub-combinations and alterations may occur depending on design requirements and other factors insofar as they are within the scope of the appended claims or the equivalents thereof.

For example, in the above-mentioned embodiment, the cam moves the arm from the lock position to the unlock position. Alternatively, for example, a directly-operable plunger driven by a solenoid, a ball-screw unit, or the like may directly press the arm. As a result, the arm moves from the lock position to the unlock position.

Further, the lock mechanism 30 is arranged at one side wall 51a of the holder 51. Alternatively, the lock mechanism 30 may be arranged at the other side wall 51b. Alternatively, the lock mechanisms 30 may be arranged at the side walls 51a, 51b, respectively.

Note that the present technology may employ the following structures.

(1) An electronic apparatus comprising: a connector configured to electrically connect with a terminal of a second electronic device; a first detector configured to detect an electrical connection between the connector and the terminal; a second detector configured to detect physical contact between the connector and the terminal; and circuitry configured to control a lock structure based on outputs of the first and second detectors.

(2) The electronic device of (1), wherein the second electronic device is a storage medium configured to store data.

(3) The electronic device of any of (1) to (2), wherein the second electronic device includes an engagement surface on an outer surface of the second electronic device, the engagement surface configured to engage with the lock structure.

(4) The electronic device of (1) to (3), further comprising: a main case; and a front panel attached to the main case, wherein the front panel includes a slot in which the second electronic device is inserted.

(5) The electronic device of (4), further comprising: an unlock button disposed on the front panel, wherein the circuitry is configured to control the lock structure to be in an unlocked state when an input is received at the unlock button.

(6) The electronic device of (4) to (5), further comprising: a lock button disposed on the front panel, wherein the circuitry is configured to control the lock structure to be in a locked state when an input is received at the lock button.

(7) The electronic device of (4) to (6), wherein the connector is configured to electrically connect with the terminal of the second electronic device when the second electronic device is disposed within the slot.

(8) The electronic apparatus of (1) to (7), further comprising: the lock structure configured to lock or unlock the second electronic device to the connector based on a control signal output by the circuitry.

(9) The electronic device of (8), wherein the lock structure includes an arm member.

(10) The electronic device of (9), wherein the arm member is configured to move between a lock position and an unlock position based on a control signal received from the circuitry.

(11) The electronic device of (10), wherein the arm member, when in the lock position, engages with an engagement portion of the second electronic device and restricts movement of the second electronic device.

(12) The electronic device of (10) to (11), wherein the lock structure includes a driver, wherein the driver is configured to move the arm member between the lock position and the unlock position based on a control signal output by the circuitry.

(13) The electronic device of (1) to (12), wherein the first detector is configured to detect whether electricity is conducted between connector and the terminal.

(14) The electronic device of (13), wherein the first detector is configured to output a detection signal generated based on whether electricity is conducted between connector and the terminal.

(15) The electronic device of (4), wherein the second detector includes a switch element disposed in the slot and configured to be actuated when the second electronic device is inserted into the slot.

(16) The electronic device of (13), wherein the second detector is configured to output a detection signal generated based on an actuation status of the switch.

(17) The electronic device of (1) to (16), further comprising: a display configured to display an operational status of the electronic device.

(18) The electronic device of (4), further comprising: an emergency button disposed on an exterior portion of the main housing, wherein the circuitry is configured to control the lock structure to unlock the second electronic device when an input is received at the emergency button.

(19) A method performed by an electronic apparatus, the method comprising: detecting an electrical connection between a connector of the electronic apparatus and a terminal of a second electronic device; detecting physical contact between the connector and the terminal; and controlling a lock structure based on outputs of the first and second detectors.

(20) A non-transitory computer-readable medium including computer program instructions, which, when executed by an electronic apparatus, cause the electronic apparatus to perform a process comprising: detecting an electrical connection between a connector of the electronic apparatus and a terminal of a second electronic device; detecting physical contact between the connector and the terminal; and controlling a lock structure based on outputs of the first and second detectors.

(21) An electronic apparatus, comprising:
 a case including an insertion slot, a storage medium being inserted into the insertion slot in a first direction, the storage medium including a connection terminal and an engagement part on an outer surface;
 a terminal electrode arranged inside the insertion slot, the terminal electrode being capable of engaging with the connection terminal;
 a lock mechanism arranged between the insertion slot and the terminal electrode, the lock mechanism including an arm member, the arm member being capable of moving between a lock position and an unlock position, the arm member at the lock position engaging with the engagement part to thereby restrict the storage medium from moving in a second direction, the second direction being opposite to the first direction, the arm member at the unlock position being not engaged with the engagement part; and
 a controller unit including a first detection mechanism, a second detection mechanism, and a driver mechanism,
  the first detection mechanism being configured to detect electric conduction between the terminal electrode and the storage medium when the storage medium is at a first position, an engagement length of engagement between the connection terminal and the terminal electrode in the first direction being a first engagement length when the storage medium is at the first position,
  the second detection mechanism being configured to detect that the connection terminal mechanically contacts the storage medium when the storage medium is at a second position, an engagement length of engagement between the connection terminal and the terminal electrode being a second engagement length when the storage medium is at the second position, the second engagement length being larger than the first engagement length,
  the driver mechanism being configured to move the arm member from the unlock position to the lock position when the first detection mechanism detects electric conduction between the terminal electrode and the storage medium, and when the second detection mechanism detects that the connection terminal mechanically contacts the storage medium.

(22) The electronic apparatus according to (21), wherein the second detection mechanism includes
 a switch element arranged inside the insertion slot, and
 an operation piece arranged between the insertion slot and the switch element, the operation piece being configured to operate the switch element in sync with movement of the storage medium from the first position to the second position.

(23) The electronic apparatus according to (21) or (22), wherein
 the arm member is capable of engaging with the engagement part in a case where the storage medium locates between the first position and the second position.

(24) The electronic apparatus according to any one of (21) to (23), wherein
 the controller unit is configured
  to determine a type of the storage medium by means of the first detection mechanism, and
  to cause the arm member not to move to the lock position in a case where the type is an unintended type.

(25) The electronic apparatus according to any one of (21) to (4), further comprising:
 a first button for ejecting the storage medium from the insertion slot in the second direction, the first button being provided on the case, wherein
 the controller unit is configured to move the arm member from the lock position to the unlock position in response to an input operation in the first button.

(26) The electronic apparatus according to any one of (21) to (25), further comprising:
 a second button provided on the case, the second button being configured to mechanically move the arm member from the lock position to the unlock position when the second button is pressed.

What is claimed is:

1. An electronic apparatus comprising:
 a connector configured to electrically connect with a terminal of an electronic device;
 a first detector configured to detect an electrical connection between the connector and the terminal in a state in which the terminal is at a first position;
 a second detector configured to detect physical contact between the connector and the terminal in a state in which the terminal is at a second position, different from the first position; and
 circuitry configured to control a lock structure based on outputs of the first and second detectors.

2. The electronic apparatus of claim 1, wherein the electronic device is a storage medium configured to store data.

3. The electronic apparatus of claim 1, wherein the electronic device includes an engagement surface on an outer surface of the electronic device, the engagement surface configured to engage with the lock structure.

4. The electronic apparatus of claim 1, further comprising:
 a main case; and
 a front panel attached to the main case, wherein the front panel includes a slot in which the electronic device is inserted.

5. The electronic apparatus of claim 4, further comprising:
 an unlock button disposed on the front panel, wherein the circuitry is configured to control the lock structure to be in an unlocked state when a first input is received at the unlock button.

6. The electronic apparatus of claim 4, further comprising:
 a lock button disposed on the front panel, wherein the circuitry is configured to control the lock structure to be in a locked state when a second input is received at the lock button.

7. The electronic apparatus of claim 4, wherein the connector is configured to electrically connect with the terminal of the electronic device when the electronic device is disposed within the slot.

8. The electronic apparatus of claim 1,
wherein the lock structure is configured to lock or unlock the electronic device electrically connected to the connector based on a control signal output by the circuitry.

9. The electronic apparatus of claim 8, wherein the lock structure includes an arm member.

10. The electronic apparatus of claim 9, wherein the arm member is configured to move between a lock position and an unlock position based on the control signal output by the circuitry.

11. The electronic apparatus of claim 10, wherein the arm member, when in the lock position, engages with an engagement portion of the electronic device and restricts movement of the electronic device.

12. The electronic apparatus of claim 10, wherein the lock structure includes a driver, and
wherein the driver is configured to move the arm member between the lock position and the unlock position based on the control signal output by the circuitry.

13. The electronic apparatus of claim 1, wherein the first detector is configured to detect whether electricity is conducted between the connector and the terminal.

14. The electronic apparatus of claim 13, wherein the first detector is configured to output a detection signal generated based on whether electricity is conducted between the connector and the terminal.

15. The electronic apparatus of claim 4, wherein the second detector includes a switch element disposed in the slot and configured to be actuated when the electronic device is inserted into the slot.

16. The electronic apparatus of claim 15, wherein the second detector is configured to output a detection signal generated based on an actuation status of the switch element.

17. The electronic apparatus of claim 1, further comprising:
a display configured to display an operational status of the electronic apparatus.

18. The electronic apparatus of claim 4, further comprising:
an emergency button disposed on an exterior portion of the main case,
wherein the circuitry is configured to control the lock structure to unlock the electronic device when an input is received at the emergency button.

19. A method performed by an electronic apparatus, the method comprising:
detecting an electrical connection, as a first detection, between a connector of the electronic apparatus and a terminal of an electronic device in a state in which the terminal is at a first position;
detecting physical contact, as a second detection, between the connector and the terminal in a state in which the terminal is at a second position, different from the first position; and
controlling a lock structure based on the first detection and the second detection.

20. A non-transitory computer-readable medium including having stored thereon, a set of computer-executable instructions, for causing a computer to execute steps comprising:
detecting an electrical connection, as a first detection, between a connector of an electronic apparatus and a terminal of an electronic device in a state in which the terminal is at a first position;
detecting a physical contact, as a second detection, between the connector and the terminal in a state in which the terminal is at a second position, different from the first position; and
controlling a lock structure based on the first detection and the second detection.

* * * * *